(12) United States Patent
Cachina et al.

(10) Patent No.: US 6,402,574 B2
(45) Date of Patent: *Jun. 11, 2002

(54) SOLDER-HOLDING CLIPS FOR APPLYING SOLDER TO CONNECTORS OR THE LIKE

(75) Inventors: Joseph Cachina, Warwick, RI (US); Jack Seidler, Flushing, NY (US); James R. Zanolli, North Smithfield, RI (US)

(73) Assignee: North American Specialties Corporation, Flushing, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,917

(22) Filed: Dec. 29, 1997

Related U.S. Application Data

(62) Division of application No. 08/726,960, filed on Oct. 7, 1996, now Pat. No. 5,875,546.
(60) Provisional application No. 60/006,205, filed on Nov. 3, 1995.

(51) Int. Cl.[7] ................................................ H01R 4/02
(52) U.S. Cl. ......................................... 439/876; 439/83
(58) Field of Search ........................ 439/83, 876, 874, 439/875; 29/843, 874, 882

(56) References Cited

U.S. PATENT DOCUMENTS

| | | |
|---|---|---|
| 3,750,252 A | 8/1973 | Landman |
| 3,905,665 A | 9/1975 | Lynch et al. |
| 3,932,934 A | 1/1976 | Lynch et al. |
| 4,120,558 A | 10/1978 | Seidler ................ 439/876 |
| 4,203,648 A | 5/1980 | Seidler |
| 4,302,067 A | 11/1981 | Monson et al. |
| 4,422,128 A | 12/1983 | Zurlinden et al. ........ 439/83 X |
| 4,556,276 A | 12/1985 | Curtis, III |
| 4,641,426 A * | 2/1987 | Hartman et al. ........ 439/876 X |
| 4,663,815 A | 5/1987 | Hartman et al. |
| 4,679,889 A | 7/1987 | Seidler |
| 4,767,344 A | 8/1988 | Noschese |
| 4,883,435 A | 11/1989 | Seidler |
| 4,884,335 A | 12/1989 | McCoy et al. |
| 5,052,954 A | 10/1991 | Seidler |
| 5,357,074 A * | 10/1994 | Pawlikowski ........... 439/874 X |
| 5,490,788 A | 2/1996 | Mazzochette |

* cited by examiner

Primary Examiner—Renee Luebke
(74) Attorney, Agent, or Firm—Darby & Darby

(57) ABSTRACT

An array and method of forming an array of solder-holding clips is provided, suitable for fabrication by automatic progressive stamping techniques, and for ganged application to a corresponding array of terminal pins of an electrical device, for soldering such pins directly to the conductive pads or internally plated holes of a substrate, or to provide a lead connecting such pins to a substrate.

4 Claims, 7 Drawing Sheets

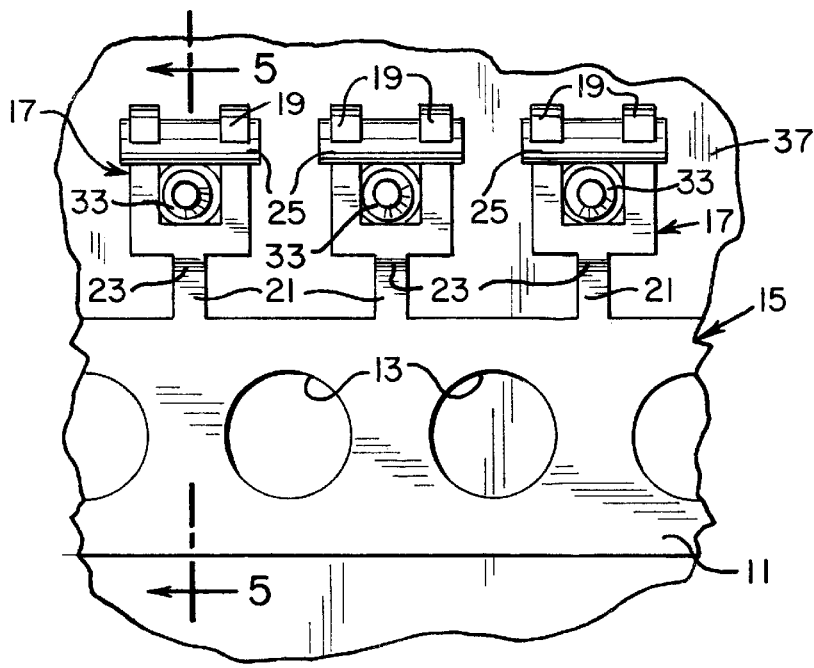
FIG. 4
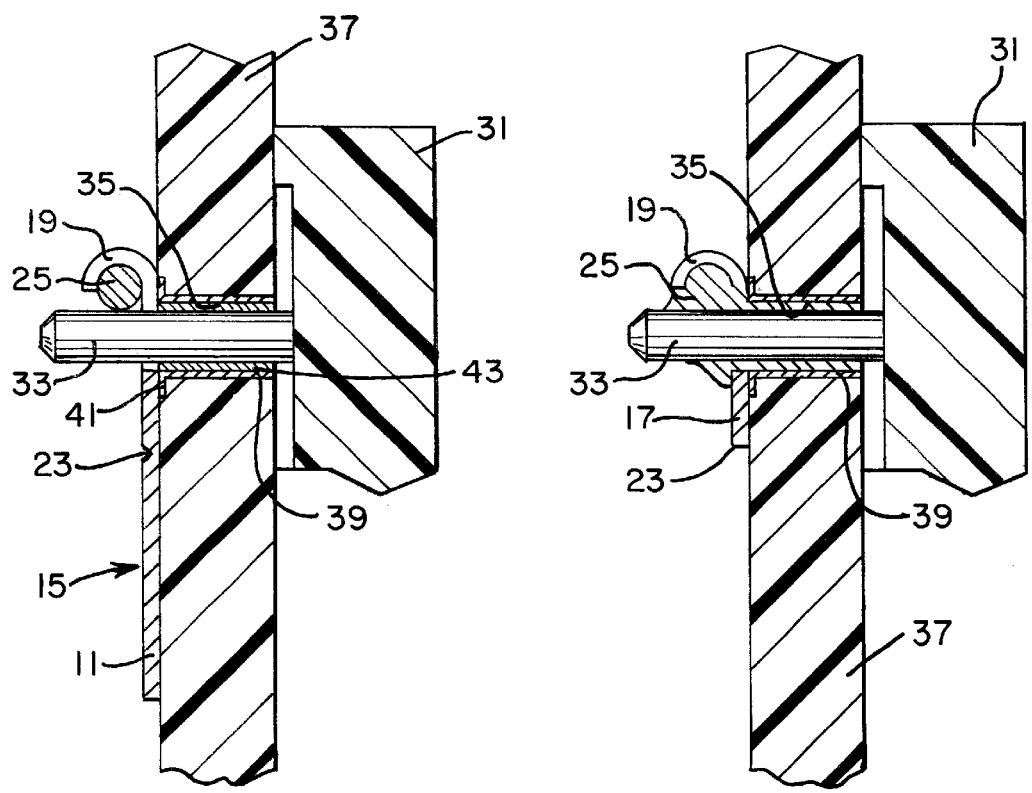
FIG. 5
FIG. 6

US 6,402,574 B2

SOLDER-HOLDING CLIPS FOR APPLYING SOLDER TO CONNECTORS OR THE LIKE

This is a division of application Ser. No. 08/726,960, filed Oct. 7, 1996, now U.S. Pat. No. 5,875,546. Each of these prior applications is hereby incorporated herein by reference, in its entirety.

The present application claims the benefit of prior provisional application Ser. No. 60/006,205 filed Nov. 3, 1995, in the names of Joseph Cachina, Jack Seidler, and James R. Zanolli, entitled "SOLDER-HOLDING CLIPS FOR APPLYING SOLDER TO CONNECTORS OR THE LIKE."

BACKGROUND OF THE INVENTION

The present invention concerns apparatus and methods for joining connectors or other electrical components, having solder-less pin-type or other terminals, to substrates, such as printed circuit boards, or to other components.

When joining a multi-terminal component, such as a connector, to a substrate by soldering, particularly a substrate with internally plated holes, special provisions have often been required, such as shown in U.S. Pat. Nos. 4,597,625; 4,802,862; 4,883,435; 5,139,448; and 5,334,059. Such components have terminals which do not carry solder, so that these situations have generally required special means for providing solder to the component terminals and to contact pads on the substrate, and/or to the electro-plated lining of holes in the substrate. One approach to providing solder to the component terminals and contact pads is to provide solder paste in and around the particular area, such as a hole. However, this approach generally does not provide a sufficient volume of solder to properly join the component terminals and contact pads.

Such connectors commonly have their pins gold-plated, which must then interface gold-to-gold with gold plating on the substrate. Accordingly, the connectors cannot be wave soldered, and are commonly either hand-soldered or have solder doughnuts placed on each terminal pin and then reflowed with hot air. For connectors with a large number of terminals, this assembly method is costly.

The present invention provides a simple and inexpensive way of applying solder in such situations, which may readily be automated, without requiring separately applying solder paste to the component terminals or to the plated holes or contact pads of the substrate.

SUMMARY OF THE INVENTION

According to the present invention, an array of solder-holding clips is provided, which is readily applied manually or by automation to a corresponding array of connector or other component terminals, facilitating joining such terminals to the contact pad and in-hole plating of a substrate or like device.

The present invention will become more apparent from the following Brief Description of the Drawings and Description of Preferred Embodiments.

BRIEF DESCRIPTION OF THE DRAWINGS

FIG. 4 shows a plan view of a fragmentary length of an embodiment of the present invention joining a connector having pin terminals to a substrate;

FIG. 5 shows an enlarged cross-sectional view of an embodiment of FIG. 4 taken along line 5—5 thereof;

FIG. 6 shows a cross-sectional view of an embodiment of the present invention similar to FIG. 5, after reflow of the solder and breaking away of the carrier strip;

DESCRIPTION OF PREFERRED EMBODIMENTS

Figure 1:
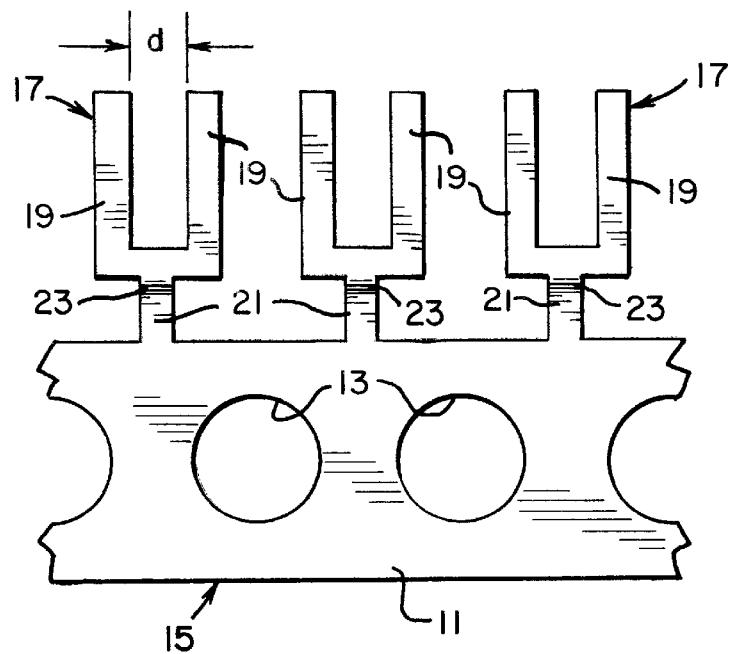
FIG. 1 shows a plan view of a fragmentary length of a blank for producing an embodiment of the present invention.

FIGS. 1–6 show one embodiment of the present invention. As seen in FIG. 1, a long flat strip 11 of electrically conductive material such as copper or beryllium copper is stamped into the shape of the intermediate blank shown. This is preferably done by progressive stamping to produce an array of a large number of repeated blanks 17 for one form of clip-holder according to the present invention. Alternatively, the strip 11 need not be formed from electrically conductive material, since the solder portions attached to the clips provide the necessary conductivity to electrically connect a terminal to a substrate or other component. The strip 11 is formed with a longitudinally extending carrier section 15 having customary indexing or sprocket holes 13 spaced along its length, to aid in moving the strip in successive steps through a progressive stamping machine. The carrier strip 15 is integral with individual clips 17 extending laterally therefrom at regular intervals therealong, spaced correspondingly to the spacing of terminals or pins on the electrical connectors with which the clips 17 are to be used in the manner described below. By way of example, the clips 17 may be spaced with a pitch of 0.05 or 0.100 inch.

Integrally formed with the carrier strip 15 are a pair of spaced fingers 19 on each clip, joined to the carrier strip 15 by a connecting piece 21, which has a notch 23 formed therein to permit the carrier strip 15 to be readily broken away or otherwise separated from the sequence of clips 17. The fingers 19 are spaced apart a distance d coordinated with the width of the pins or terminals of the circuit element 31 (see FIGS. 4 to 6) with which the clip 17 is used.

Figure 2:
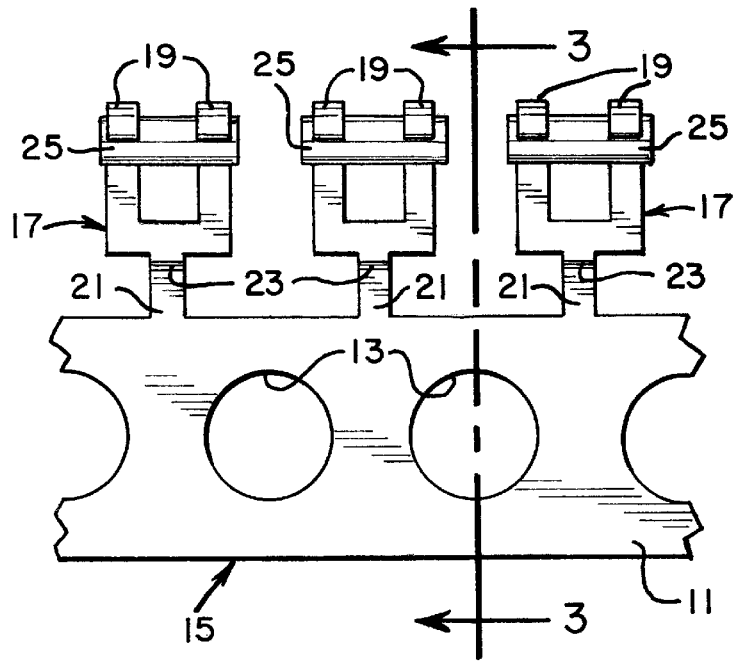
FIG. 2 shows a plan view of a fragmentary length of a finished product according to the present invention, using the blank of FIG. 1.
Figure 3:
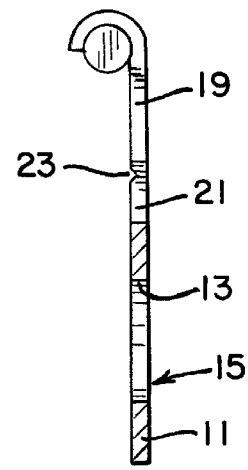
FIG. 3 shows a cross-sectional view of FIG. 2 taken along line 3—3 thereof.

As seen in FIGS. 2 and 3, a solder mass 25, preferably in the form of a section of solder wire, is placed across the pairs of fingers 19, which are then rolled partially around the solder mass 25, sufficiently to hold the solder in place. This is readily fabricated in the course of the progressive stamping, by laying a solder wire 25 (which preferably includes a solder flux) across a number of the clips 17, curling the fingers 19 around the solder wire 25 as shown in FIGS. 2 and 3, and cutting away the solder in the area between the clips 17, leaving a solder mass 25 held by each pair of fingers 19, and of a volume appropriate for the required soldering action.

In use, as shown in FIGS. 4 and 5, a connector or other circuit component 31 having a plurality of aligned terminals or pins 33 is passed through correspondingly spaced internally electroplated holes 35 of a substrate 37. While the substrate 37 is illustrated as oriented vertically in FIG. 5, it will be understood that it may be horizontal or with other orientations, as may be appropriate. A ganged strip of clips 17 of which a portion is shown in FIG. 2, with a number of clips corresponding to the number of component terminals to be soldered to the substrate 37, is then placed over the array of connector terminals 33 as illustrated in FIG. 4. For example, if the component 31 has 21 terminals in alignment, a section of the clip array of FIG. 4 having 21 clips will be applied over the component terminals 33 as shown, and severed from the remainder. The separation of the fingers 19 of each clip is selected so that there will be a frictional engagement between each clip 17 and its corresponding connector terminal 33, so that the strip of clips will be retained in the position shown in FIGS. 4 and 5 during subsequent operations. It will be understood that where the component 31 has two or more rows of terminals, each row of terminals of the component 31 may be provided with a strip of the clips of FIG. 4, although only one row is shown in FIGS. 4 and 5.

Then, heat is applied to the solder, as by heated air or other conventional means, which causes the solder to reflow and to be drawn by capillary action into the space between the terminal 33 and the sides of the plated substrate hole 35. The hole 35 has a metallic surface, as by being electroplated on its interior, as indicated at 39. The plating may extend around onto the flat surface of the substrate 37 to form contact pads, as illustrated at 41. Normally, a slight space 43 is left between the terminal 33 and the plating 39 of the substrate hole 35, into which the molten solder will be drawn. In normal practice this space may not be deliberately provided, since the customary slight irregularities in formation of the component terminal or the electro-plating 39 in the hole 35 will permit the molten solder to flow therebetween to bond the terminal 33 to the electro-plated layer 39, as indicated in FIG. 6. After the soldering is completed, the carrier strip 15 is broken away from the individual clips 17 at the breakaway notches 23, leaving the clips 17 in place but soldered to the component terminal, the plating of the hole, and to the contact pad 41. If desired, the carrier strip may be broken away before the soldering is accomplished, although this is not preferred.

Figure 7:
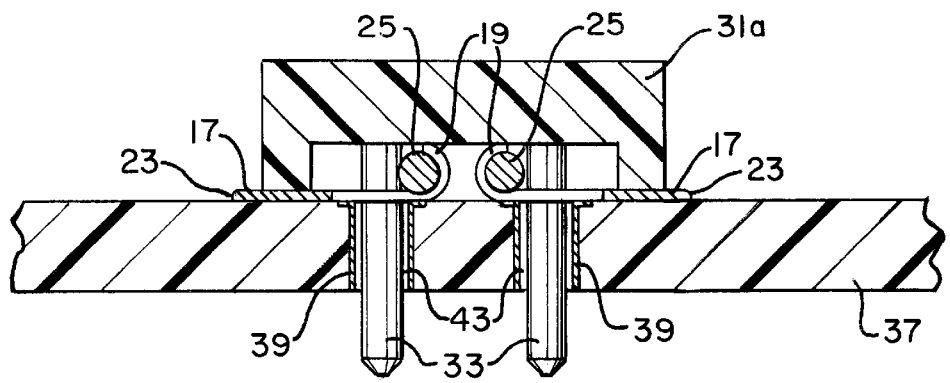
FIG. 7 shows a cross-sectional view similar to FIG. 5, of another embodiment of the present invention, with the solder-holding clip in a different position.

FIG. 7 shows an alternate way of using the clips of FIGS. 2 and 3. In this instance, a connector or other component 31*a* is shown having two rows of terminal pins 33 instead of one row as shown in FIG. 5. In this instance the clips 17 are positioned on the component pins 33 before the component pins 33 are inserted into the substrate 37, and are positioned between the component 31*a* and the substrate 37. Heat is supplied as in the case of FIGS. 5 and 6 to join the pins 33 to the plated hole 39 of the substrate by soldering.

Figure 8:
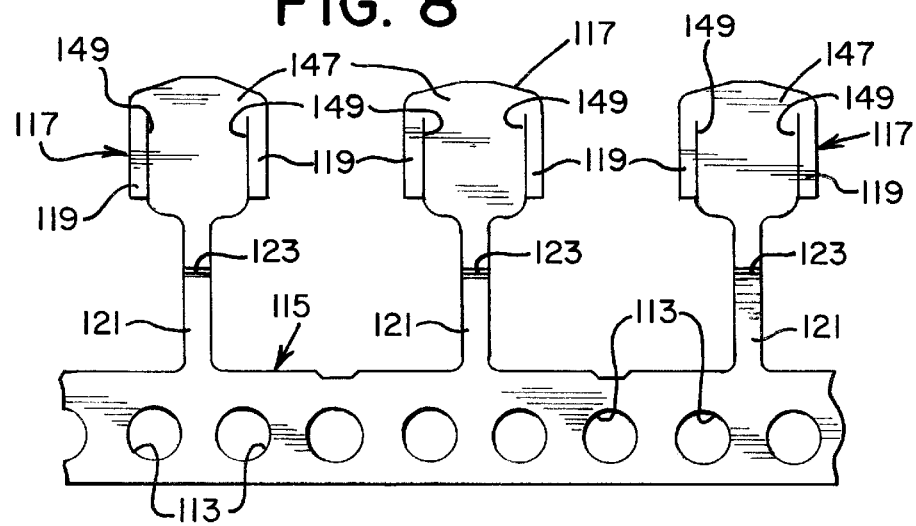
FIG. 8 shows a plan view of a fragmentary length of a blank for producing a modified form of the present invention.
Figure 9:
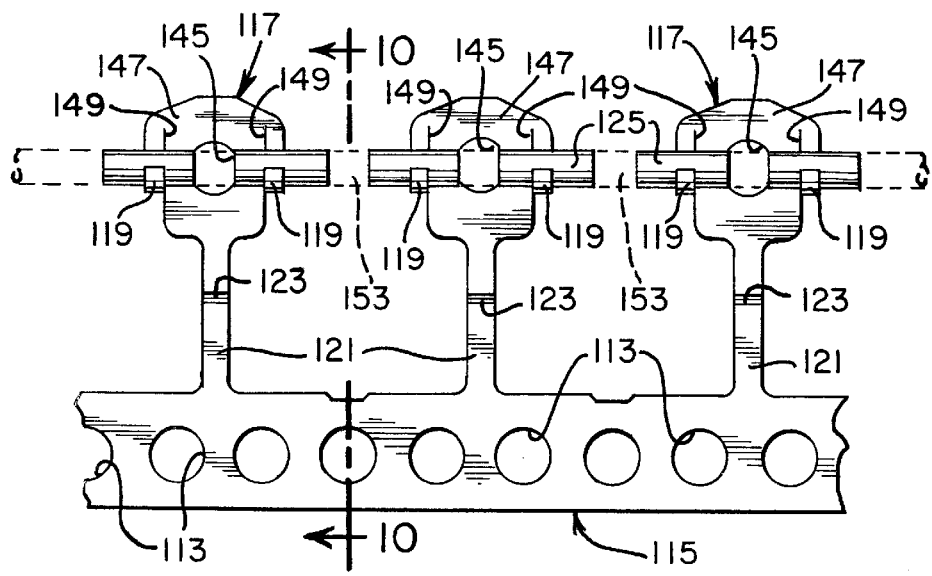
FIG. 9 shows a plan view of a fragmentary length of a solder-holding clip array using the blank of FIG. 8.
Figure 10:
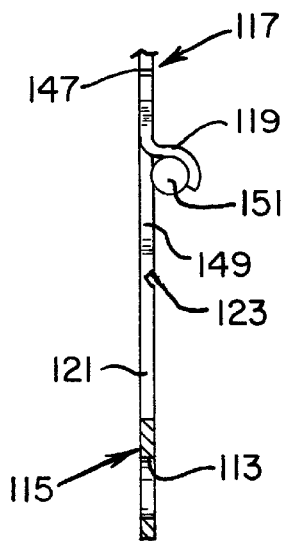
FIG. 10 shows a cross-sectional view of FIG. 9 viewed along line 10—10 thereof.
Figure 11:
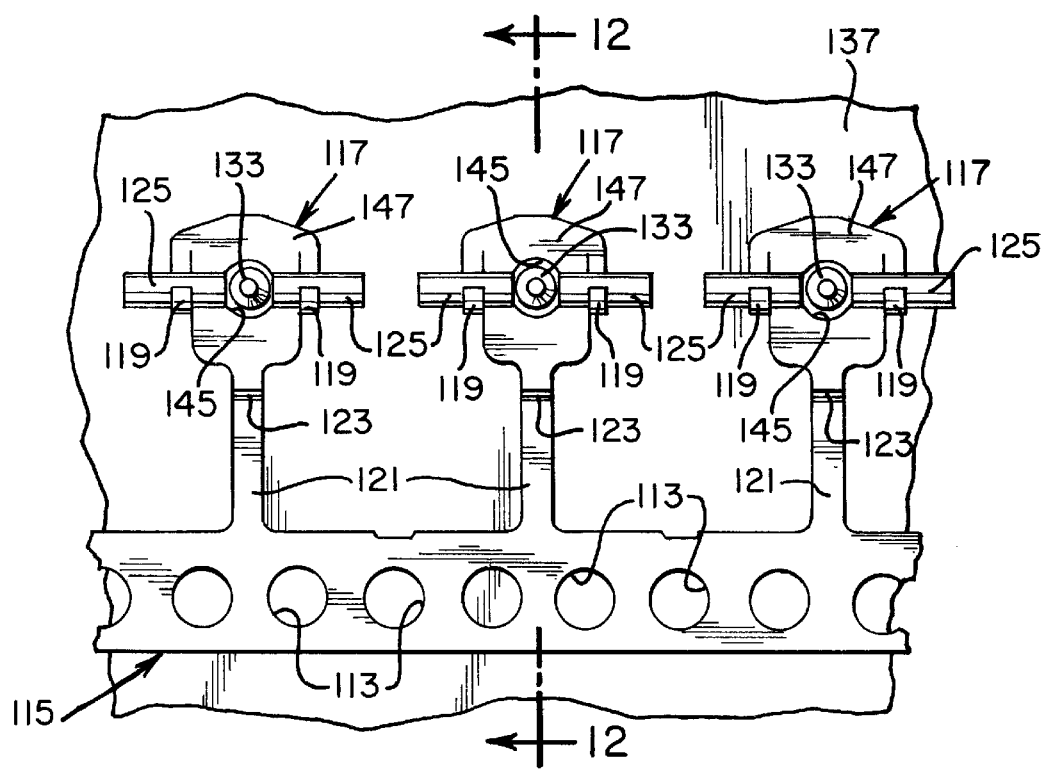
FIG. 11 shows a plan view of a fragmentary length of the clip holder arrangement of FIG. 9 joining a connector to a substrate.

FIGS. 8 through 12 show a modified form of the present invention. As seen in FIG. 8, the blank has a carrier strip 115 with indexing holes 113 similar to FIG. 1. Extending laterally from the carrier strip 115 are the individual solder-holding clips 117. As seen in FIG. 8, each clip blank 117 is joined to the carrier strip 115 by a connecting piece 121 having a breakaway notch 123. The individual clip blank 117 includes a body portion 147 having slits 149 extending adjacent the edges of the body portion 147 to form fingers 119 integral at one end with the body portion 147. As indicated in FIG. 9, a solder wire 151 (preferably including a solder flux) is laid over the successive body portions 147 of a portion of the array of clips 117 as the array moves along the progressive stamping apparatus. As seen in FIGS. 9 to 11, the fingers 119 are then curled around the solder wire 151 to hold it on the body portions 147. After the solder wire 151 is applied and held by the fingers 119, holes 145 are formed as seen in FIG. 9, as by punching through the clip bodies 147. At the same time, the solder wire 151 is separated into two segments straddling each hole 145 and a gap 153 is made in the solder wire 151 between adjoining clip bodies 147 as seen in FIGS. 9 and 11. In this way, each body portion 147 carries two solder masses 125, straddling its hole 145. The holes 145 are dimensioned to engage the component terminals 133 frictionally, to position a solder mass on either side of the respective terminal 133 as shown in FIG. 11. In this way the array of clip bodies is retained on the component terminals 133. The solder masses 125 remaining held by each clip body 147 are dimensioned to provide adequate solder for joining each clip 117 to its respective component terminal 133.

Figure 12:
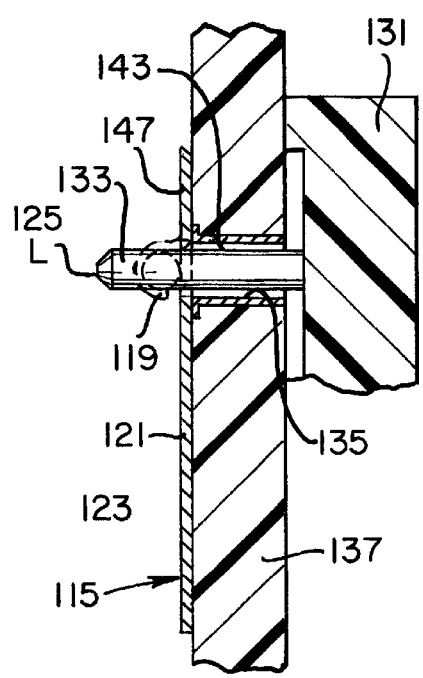
FIG. 12 shows an enlarged cross-sectional view of FIG. 11 viewed along line 12—12 thereof.

As seen in FIGS. 11 and 12, this form of solder-holding clip may be used in the same manner as shown in FIGS. 6 or 7 or 12.

Figure 13:
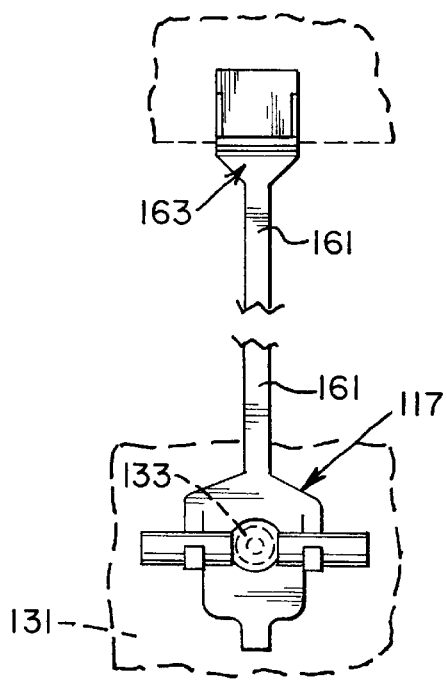
FIG. 13 shows a fragmentary plan view of a modification of the device of FIG. 12, adapting it to connect to a second substrate.
Figure 14:
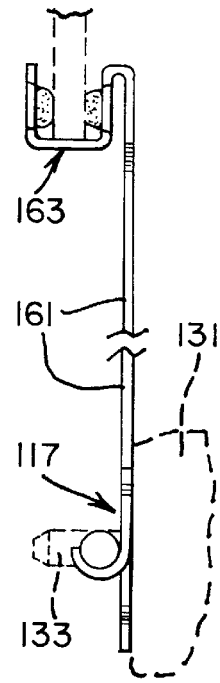
FIG. 14 shows a side view of the device of FIG. 13.

Further, the clip 117 may be used to join a component 31 or 131 with any desired further substrate or another component, whether or not substrate 137 is present. As shown in FIGS. 13 and 14, the clips 117 may be formed with extensions 161 which may be used as terminals or leads to other apparatus. For example the end of each extension 161 may be formed into an edge clip shape 163 for a substrate as shown in FIG. 13 and 14, to permit coupling of the component 131 pins to a further substrate (not shown) parallel to the component 131 or in alignment thereto. By bending extension 161 at right angles, the further substrate may be perpendicular to substrate 137. In place of edge clip 163, the end of each extension 161 may be formed for surface mounting to a substrate contact pad, or may have any other desired configuration.

Figure 17:
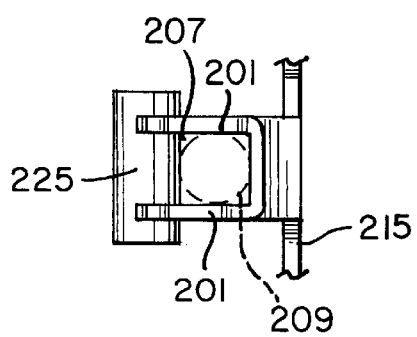
FIG. 17 shows a fragmentary top view of FIG. 16 viewed along the line 17—17 thereof.
Figure 18:
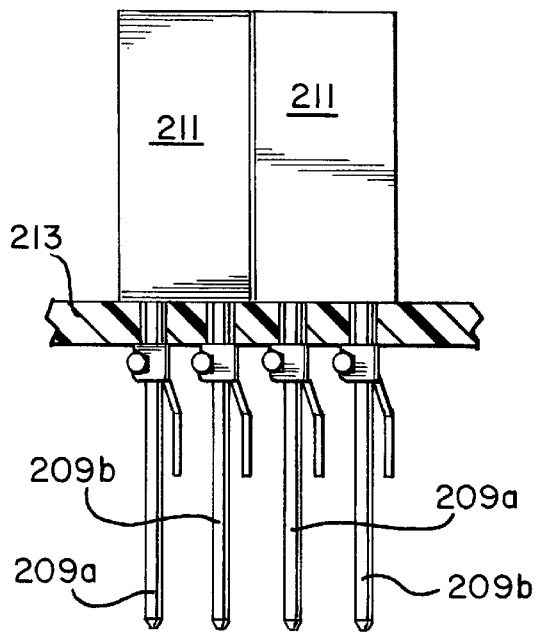
FIG. 18 shows the device of FIG. 15 assembled on a pair of connectors.

FIGS. 15–18 show a further modification of the present invention. In this instance, each solder-holding clip 219 is formed with a pair of sides 201 joined by a back 203. Each side 201 has a pair of fingers or tabs 205 extending partially around a solder mass 225, leaving a space 207 between the solder mass 225 and the back 203, for receiving a terminal pin 209 of a connector 211. Alternatively, preferably the spacing between the arms 201 is dimensioned to frictionally engage the pins 209. As shown in FIG. 18, the pin 209 passes through a substrate 213, having an internally plated hole and/or a conductive pad to which the pin 209 is to be soldered.

Figure 15:
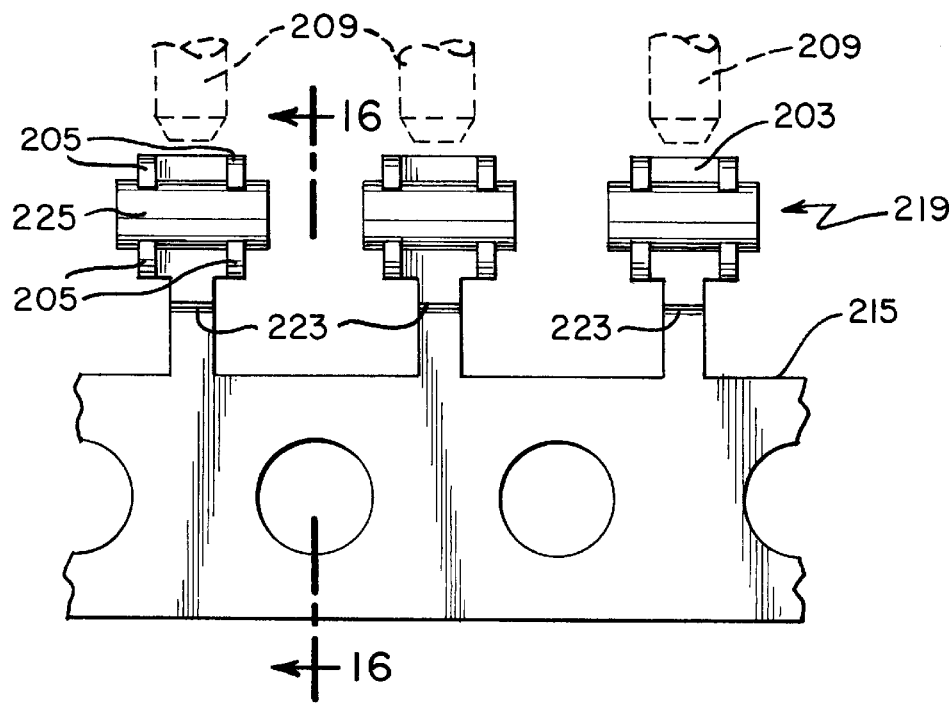
FIG. 15 shows a plan view of another embodiment of the present invention.
Figure 16:
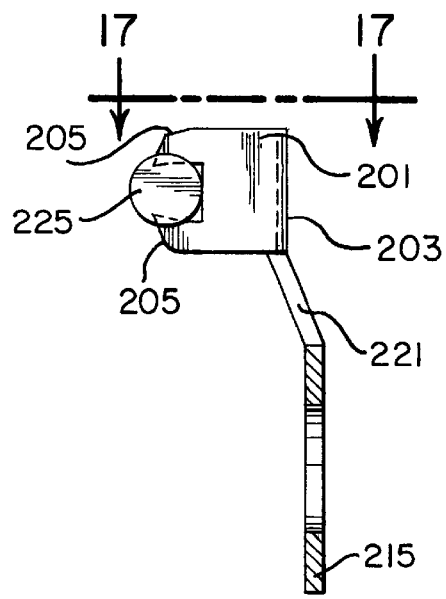
FIG. 16 shows a cross section of the embodiment of FIG. 15 viewed along line 16—16 thereof.

This form of invention also is adapted for multi-stage progressive stamping. In fabrication, an elongated strip of conductive material is stamped as shown in FIG. 15 to have a carrier strip 215 with a series of the clips 219 extending laterally therefrom. The body is bent into the U-shape shown in FIG. 17 to form clip sides 201 each with a pair of tabs or fingers 205. A solder wire 225 of a diameter conforming to the separation between the pairs of fingers 205 is laid between the pairs of fingers 205, and the fingers are then bent partially around and staked into the solder wire 225. The solder wire 225 is then cut between the clips 219, leaving an amount of solder appropriate for the specific use for the clips. A connecting portion 221 serves to join the clip 219 to the carrier strip 215, and is bent with an offset as shown in FIGS. 17 and 18, so that when assembled to a row of terminals 209, interference is avoided between the terminal pins 209a and 209b and the carrier strip 215.

The spacing between the clips 209 is correlated to the spacing between the pins 209a or 209b of the connector 211, so that in use a section of the strip of FIG. 15 having a number of clips 219 equal to the number of pins 209 in a row of the connector 211, may be inserted over the pins 209 as shown in dashed lines 209 in FIG. 15 and also in FIG. 18. FIG. 18 shows connectors 211 illustratively of the dual row type, having terminal pins 209a and 209b equally spaced in the direction perpendicular to the plane of the paper. It will be understood that the present invention may be used with any number of rows of terminal pins, from one row up. By way of illustration, the connectors 211 may be of the J1 or J2 type, and the substrate 213 may be a PC104 board. Illustratively the terminals 209 may be spaced at 0.100 inch intervals, and the pins may be 0.480 inches long with a 0.025 inch square cross section.

Upon reflowing, the solder will flow around the pins 209 and by capillary action into the internally plated holes of the substrate 213. After the soldering is completed, each clip has its joining section 221 broken or cut off, as by a notch 223 formed therein.

Figure 19:
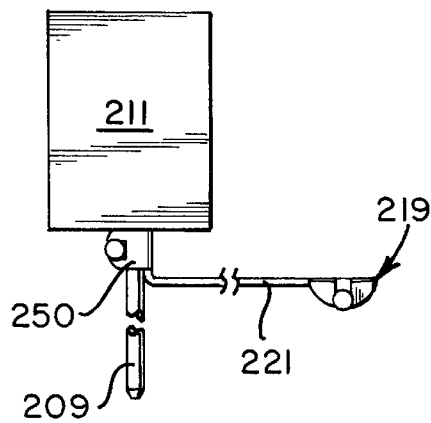
FIG. 19 shows an alternative embodiment for surface mounting a connector on a substrate.

The solder-holding clips of the present invention are usable not only to solder a connector or other component having non-solder-bearing terminals to through-plated holes of a substrate, but may also be used to solder a lead having any desired terminal configuration to a pin or other terminal of an electrical component. FIG. 19 shows the lead clip 219 with its lead 221 bent out at a right angle to terminal pin 209, and terminated in a solder-holding arrangement 250 to permit surface mounting of connector 211 on a substrate (not shown). The solder-holding arrangement may have any appropriate construction, such as shown in U.S. Pat. No. 4,679,889.

Figure 20:
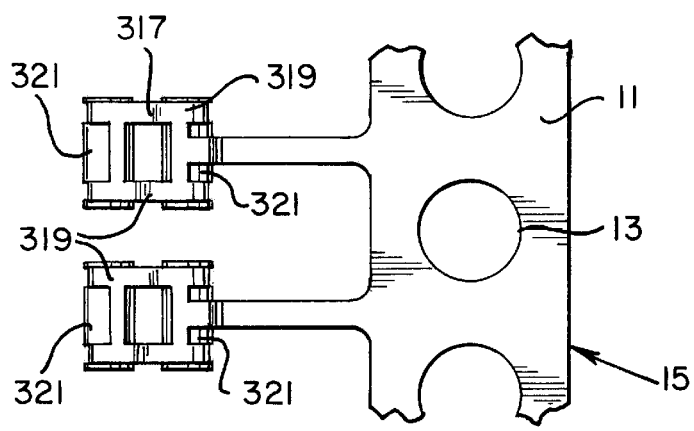
FIG. 20 shows a plan view of another embodiment of the present invention.

Referring now to FIG. 20, therein is shown an alternative embodiment of the present invention, which is similar to that shown in FIGS. 1–6. However, as seen in FIG. 20, clip 317 is provided with two pairs of fingers 319, with one pair of fingers being located on the side of clip 317 adjacent carrier strip 15, and the other pair of fingers being located on the opposite side of clip 317. Clip 317 has a generall double I-shape, which may be formed by a progressive stamping operation. Two solder portions 321 are positioned laterally across the two pairs of fingers 319. The solder portions 321 may be formed in much the same manner as solder wire 25 (FIG. 2).

Figure 21:
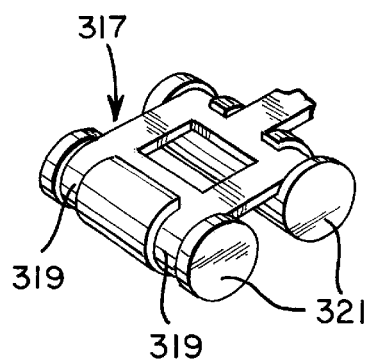
FIG. 21 shows a perspective view of a portion of the device of FIG. 20.
Figure 22:
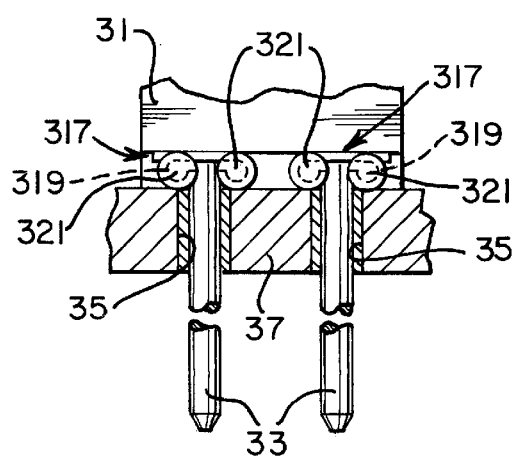
FIG. 22 shows the device of FIG. 20 positioned between a connector and a circuit board, prior to solder reflow.
Figure 23:
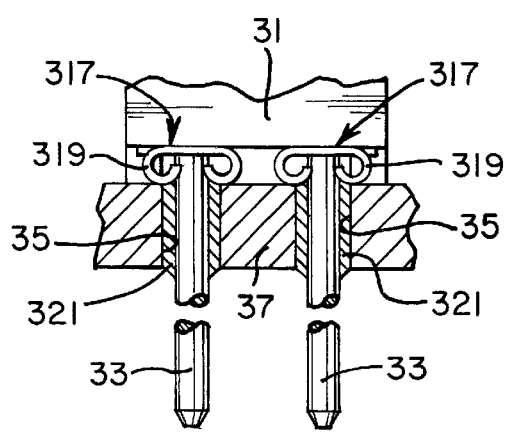
FIG. 23 shows the device of FIG. 22, after solder reflow.

Each pair of fingers 319 is then curled around the corresponding solder portion 321 to thereby securely retain the solder portion 321 (FIG. 21). As shown in FIG. 20, the solder sections 321 extend partially into the central aperture in clip 317. Referring now to FIG. 22, therein is shown a connector or other circuit component 31 having a plurality of pins 33, with each of the pins 33 passing through the central aperture of a corresponding clip 317. Because the solder portions 321 extend partially into the central aperture, they act to frictionally engage the inserted pin 33. After the clips 317 are positioned on the connector 31, the pins 33 are subsequently inserted into corresponding holes 35 of a substrate 37. Heat is then applied, which causes the solder sections 321 to reflow and be drawn into the space between the terminals 33 and the sides of the holes 35 (FIG. 23). Although the clip 317 shown in FIGS. 20–23, is shown as being positioned between the connector 31 and substrate 37, the clip 317 may also be used where it is positioned after the substrate 37 is mated with the clip 317, similar to FIG. 5.

Figure 24:
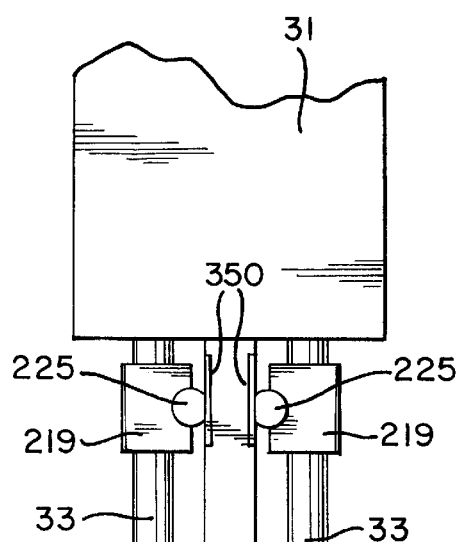
FIG. 24 shows an elevational view of another embodiment of the present invention.

Referring now to FIG. 24, therein is shown the use of a pair of clips 219 (after the removal of connecting portion 221) for soldering a pair of pins 33 on a connector 31 to a pair of contact pads 350 positioned on opposite sides of a substrate 37. Effectively, the pair of clips 219 provide a "straddle mount" between the connector pins 33 and the substate 37. As shown in FIG. 24, the clips 219 are positioned with their solder portions 225 facing each other. The connector pins 33 are then inserted into the opposed clips 219, and the substrate is positioned in between clips 219 so as to be frictionally engaged by the opposed solder portions 225. Heat is applied, as described above, to cause the solder to reflow. The clips 219 may be provided as a pair of arrays to thereby solder an edge connector to two rows of contact pads, wherein each row is positioned on opposite sides of the substrate 37.

It will be understood that the solder elements 25, 125, 151 and 321 may incorporate customary solder flux to facilitate the proper soldering operation.

While the solder-holding clips of the present invention are illustratively described as used with the terminals of a connector, it will be understood that these clips may be used in joining terminals of integrated circuit chips, chip holders, resistors, capacitors and other non-solder bearing electrical components to contact pads or plated holes of printed circuit boards or other substrates.

The foregoing embodiments should be understood as exemplary only, the present invention being defined by the following claims.

What is claimed is:

1. A solder-holding clip for joining to a terminal of an electrical device, said clip comprising:
    a body having a planar portion having an opening for receiving said terminal, said opening being dimensioned for engaging said body on said terminal, said body having a solder-holding conformation adjacent said opening, wherein said body has a U-shaped conformation with a pair of sides and a back joining said sides, each side having a pair of spaced tabs, and
    a solder mass held between said pair of tabs of each pair of sides.

2. The solder-holding clip of claim 1, wherein:
said solder is spaced from said clip back to form with said clip sides a terminal—receiving opening therebetween.

3. The clip claim 1, wherein one side is parallel to the other side.

4. The clip of claim 1, wherein a space is formed between the solder mass and the back of the body for receiving the terminal.

* * * * *